(12) United States Patent
Jeong et al.

(10) Patent No.: US 10,860,124 B2
(45) Date of Patent: Dec. 8, 2020

(54) ELECTROLUMINESCENCE DISPLAY DEVICE AND METHOD OF FABRICATING THEREOF

(71) Applicant: LG Display Co., Ltd., Seoul (KR)

(72) Inventors: Beom Jeong, Daejeon (KR); SangWoo Seo, Daegu (KR); WonChang Do, Daegu (KR); SeongTae Cho, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/176,906

(22) Filed: Oct. 31, 2018

(65) Prior Publication Data

US 2019/0138141 A1 May 9, 2019

(30) Foreign Application Priority Data

Nov. 9, 2017 (KR) .................. 10-2017-0148452

(51) Int. Cl.
*G06F 3/041* (2006.01)
*G06F 3/044* (2006.01)
*H01L 27/32* (2006.01)
*H01L 51/52* (2006.01)

(52) U.S. Cl.
CPC ............ *G06F 3/0412* (2013.01); *G06F 3/044* (2013.01); *G06F 3/0416* (2013.01); *G06F 3/0446* (2019.05); *G06F 3/04164* (2019.05); *H01L 27/323* (2013.01); *H01L 51/5253* (2013.01)

(58) Field of Classification Search
CPC ...... G06F 3/044; G06F 3/0412; G06F 3/0416; G06F 2203/04103; G06F 2203/04107; G06F 2203/04111; G06F 3/0418; G06F 1/16; G06F 3/041
See application file for complete search history.

(56) References Cited

U.S. PATENT DOCUMENTS

| | | | |
|---|---|---|---|
| 2013/0141380 A1* | 6/2013 | Wang | G06F 3/041 345/173 |
| 2013/0314360 A1* | 11/2013 | Saitoh | G06F 3/0412 345/173 |
| 2014/0008668 A1* | 1/2014 | Hirakata | H01L 27/322 257/79 |
| 2014/0049892 A1* | 2/2014 | Huang | G06F 3/044 361/679.21 |
| 2017/0192560 A1* | 7/2017 | Ham | G06F 3/016 |
| 2017/0308199 A1* | 10/2017 | Liu | G06F 3/044 |
| 2018/0013096 A1* | 1/2018 | Hamada | H01L 51/5256 |

FOREIGN PATENT DOCUMENTS

KR 10-2016-0025673 A 3/2016

* cited by examiner

*Primary Examiner* — Pegeman Karimi
(74) *Attorney, Agent, or Firm* — Fenwick & West LLP

(57) ABSTRACT

The electroluminescence display device and the method of manufacturing the same are disclosed. The electroluminescence display device may include an on-cell type touch screen panel and a flexible printed circuit (FPC) for slimming down and cost reduction. It is possible to suppress cracks from being generated in the pad portion of the touch screen panel during film on glass (FOG) bonding by arranging the lower layer of the FPC at a certain distance away from the end of the touch screen panel.

21 Claims, 10 Drawing Sheets

ELECTROLUMINESCENCE DISPLAY DEVICE AND METHOD OF FABRICATING THEREOF

CROSS-REFERENCE TO RELATED APPLICATIONS

This application claims the priority to the Republic of Korea Patent Application No. 10-2017-0148452 filed on, Nov. 9, 2017, in the Korean Intellectual Property Office, the disclosure of which is incorporated by reference in its entirety.

BACKGROUND

Technical Field

The present disclosure relates to an electro-luminescence display device and a method of manufacturing the same, and more particularly, to an electro-luminescence display device having an on-cell type touch screen panel and a method of manufacturing the same.

Related Technology

The electro-luminescence display device is a self-luminous display device, and unlike a liquid crystal display device, a separate light source is not required, so that the electro-luminescence display device can be manufactured in a light and thin shape. In addition, the electro-luminescence display device is advantageous not only in terms of power consumption in accordance with low voltage driving but also in response speed, viewing angle, and contrast ratio. Thus, it is being studied as a next generation display. Electro-luminescence display devices are typically studied for organic light emitting display devices and quantum dot (QD) display devices.

Such display devices are widely used in various electronic devices such as TV, computer monitor, laptop computer, mobile phone, display device in refrigerator, personal digital assistants (PDAs), and automated teller machine (ATM). Generally, these display devices configure an interface for users by using various input devices such as keyboard, mouse, digitizer, and the like. However, the use of a separate input device such as a keyboard and a mouse has been required to learn how to use it. In addition, it causes inconveniences such as occupying space. Accordingly, it is difficult to increase quality of the product. Thus, there is a growing demand for input devices, which is convenient and simple with less malfunctions. In accordance with this demand, a touch screen panel has been proposed in which a user directly touches a screen with a hand or a pen to input information.

The touch screen panel is applicable to various display devices because it is simple, has less malfunction, can be input without having a separate input device, and a user can quickly and easily operate the contents displayed on the screen with the touch screen panel.

The touch screen panel can be a resistive type in which a metal electrode is formed on a top plate or a bottom plate to detect a touched position with a voltage gradient according to a change in resistance by applying a DC voltage, a capacitive type in which conductive layers form an electric potential and it detects the position where the voltage changes of the upper and lower plate according to the touch, an electro-magnetic induction type that reads the LC value derived as the electronic pen touches the conductive film and senses the touched position, and the like.

The capacitive touch screen panel may be formed as an add-on type, an on-cell type, or an in-cell type according to its structure. The add-on type is that a touch sensor is attached to an upper plate of a display device after separately manufacturing a display device and a touch sensor. The on-cell type is a structure for directly forming elements constituting the touch sensor on the surface of the upper substrate of the display device. The in-cell type has a built-in touch sensor in the display device to achieve a thin display device and enhance durability.

SUMMARY

Embodiments relate to an electroluminescence display device. The display device comprises a display panel, a touch screen panel attached to the display panel by an adhesive, and a flexible printed circuit board. The flexible printed circuit board comprises a conductive layer and a lower layer covering a portion of the conductive layer. The lower layer is closer to the display panel than the conductive layer. Another portion of the conductive layer is attached to the touch screen panel by an anisotropic conductive film. The lower layer of the flexible printed circuit board is spaced apart from ends of the adhesive and the touch screen panel by at least a predetermined distance.

In some embodiments, the flexible printed circuit board further comprises an upper layer at an opposite side of the conductive layer relative to the lower layer. In some embodiments, the upper layer and the lower layer are made of insulating layers. In some embodiments, an anti-oxidation layer is on a surface of the portion of the other portion of conductive layer in contact with the touch screen panel.

In some embodiments, the conductive layer is attached to the touch screen panel by the anisotropic conductive film to electrically connect the conductive layer and the touch screen panel.

In some embodiments, the display panel includes an electroluminescence diode.

In some embodiments, the adhesive includes a pressure sensitive adhesive (PSA).

In some embodiments, the adhesive is partially protruded from the end of the touch screen panel towards the lower layer and the lower layer of the flexible printed circuit board is spaced apart from an end of the protruded adhesive by at least the predetermined distance.

In some embodiments, a portion of the touch screen panel on which the flexible printed circuit board is attached is tilted toward the end of the touch screen panel.

Embodiments also relate to a method of manufacturing an electroluminescence display device. A touch screen panel is attached to a display panel by an adhesive. An anisotropic conductive film is attached to a pad portion of the touch screen panel. A portion of a conductive layer of a flexible printed circuit board is attached to the pad portion of the touch screen panel through the anisotropic conductive film. The conductive layer is attached in a manner that an insulating layer covering another portion of the conductive layer is spaced at least a predetermined distance from ends of the adhesive and the touch screen panel.

In some embodiments, the a portion of the adhesive protrudes from the end of the touch screen panel, and the flexible printed circuit board is attached to the pad portion of the touch screen panel with the insulating layer of the flexible printed circuit board spaced from the end of the protruded adhesive by the predetermined distance.

In some embodiments, a portion of the anisotropic conductive film is pressed by the flexible printed circuit board to protrude from the end of the touch screen panel, and the protruded anisotropic conductive film is spaced apart from the insulating layer of the flexible printed circuit board by the predetermined distance to expose the conductive layer.

Embodiments also relate to an electroluminescence display device comprising a display panel, a touch screen panel, and flexible printed circuit board. The display panel includes and electroluminescence diode. The touch screen panel is attached on the display panel by an adhesive. The flexible printed circuit board comprises a conductive layer and a lower layer. The conductive layer has a portion attached to the touch screen panel by an anisotropic conductive film, and the lower layer is on another portion of the conductive layer, the lower layer of the flexible printed circuit board spaced apart from an end of the adhesive and a corresponding end of the touch screen panel by at least a predetermined distance.

In some embodiments, a distance from the lower layer of the flexible printed circuit board to the corresponding end of the touch screen is greater than a protrusion distance of the adhesive from the corresponding end of the touch screen panel.

Embodiments also relate to a display device comprising a display panel, a touch screen panel, a layer of adhesive, and a flexible printed circuit board. The display panel has a surface configured to display images. The touch screen panel is on the surface of the display panel, and the touch screen panel is configured to detect touch events on a surface of the touch screen panel. The layer of adhesive is between the surface of the display panel and the touch screen panel. The flexible printed circuit board is attached to the touch screen panel and comprises a conductive layer and an insulating layer. The conductive layer is attached to the touch screen panel via an anisotropic conductive film to transmit signals to and from the touch screen panel or the display panel, and the insulating layer covers the conductive layer. An end of the insulating layer is separated from a corresponding end of the adhesive, a corresponding end of the touch screen panel, and a corresponding end of the anisotropic conductive film by at least a predetermined distance in a direction parallel to the surface of the display panel.

In some embodiments, an anti-oxidation layer is on a surface of the conductive layer in contact the anisotropic conductive film and the insulating layer.

In some embodiments, the anisotropic conductive film protrudes from the corresponding end of the touch screen panel.

In some embodiments, the flexible printed circuit board further comprises a substrate on a surface of which the conductive layer is placed and another insulating layer covering another surface of the conductive layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
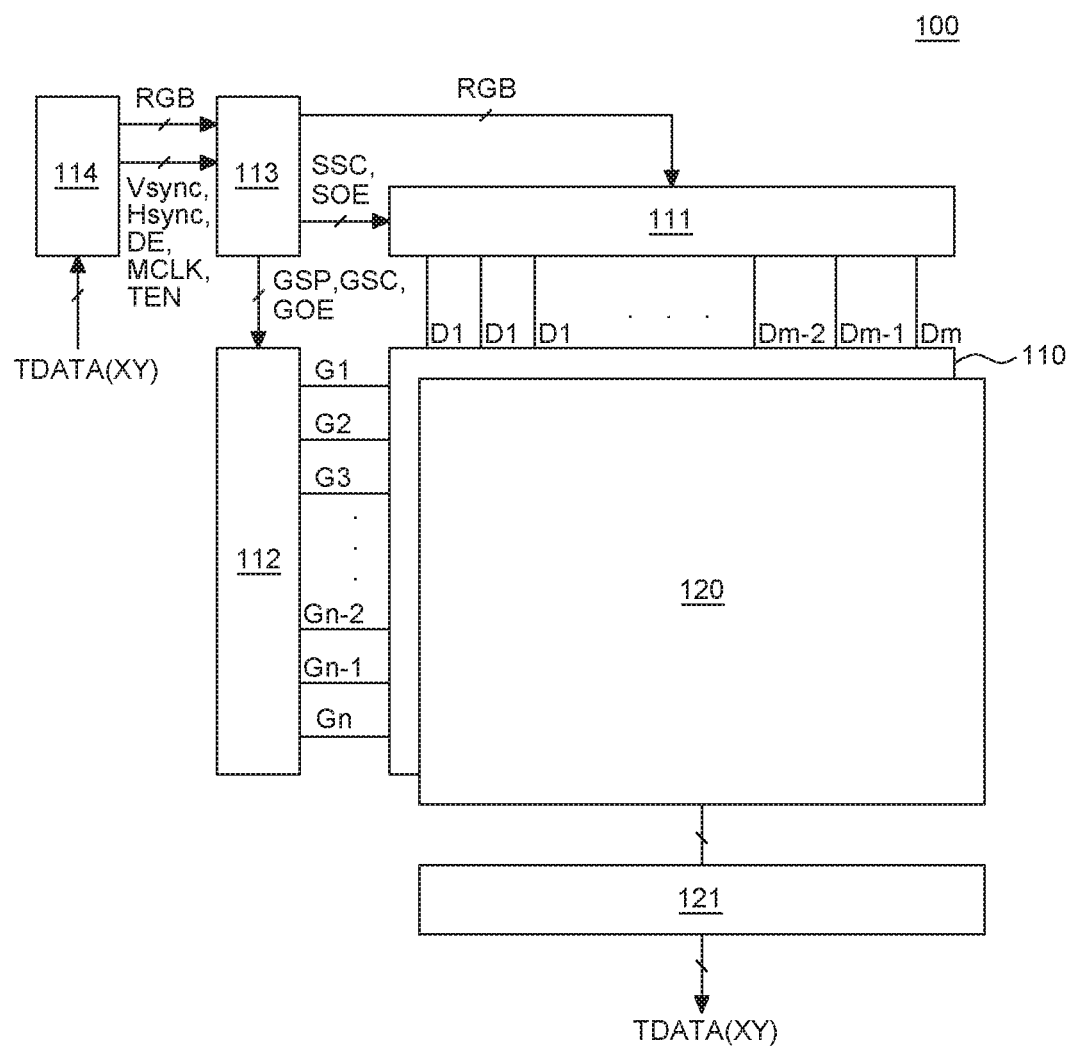
FIG. 1 is a schematic view illustrating a structure of an electroluminescence display device according to an embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other elements to be added unless the terms are used with the term "only". Any references to singular may include plural unless expressly stated otherwise.

Elements are interpreted to include an ordinary tolerance range even if not expressly stated.

When the position relation between two parts is described using the terms such as "on", "above", "below", and "next", one or more parts may be positioned between the two parts unless the terms are used with the term "immediately" or "directly". It is to be understood that an element or layer is referred to as being "on" another element or layer, including either intervening layers or other elements directly on or in between.

Although the terms "first," "second," and the like are used for describing various elements, these elements are not confined by these terms. These terms are merely used for distinguishing one element from the other elements. Therefore, a first element to be mentioned below may be a second element in a technical concept of the present disclosure.

Like reference numerals refer to like elements throughout the specification.

The sizes and thicknesses of the individual elements shown in the drawings are shown merely for convenience of explanation and the present disclosure is not necessarily limited to the size and thickness of the elements shown in the drawings.

Each of the features of the various embodiments of the present disclosure can be combined or combined with each other partly or entirely. The features of the various embodiments can be technically interlocked and driven as well. The features of the various embodiments can be practiced independently or in conjunction with each other.

Hereinafter, various embodiments of the present disclosure will be described in detail with reference to accompanying drawings.

Figure 2:
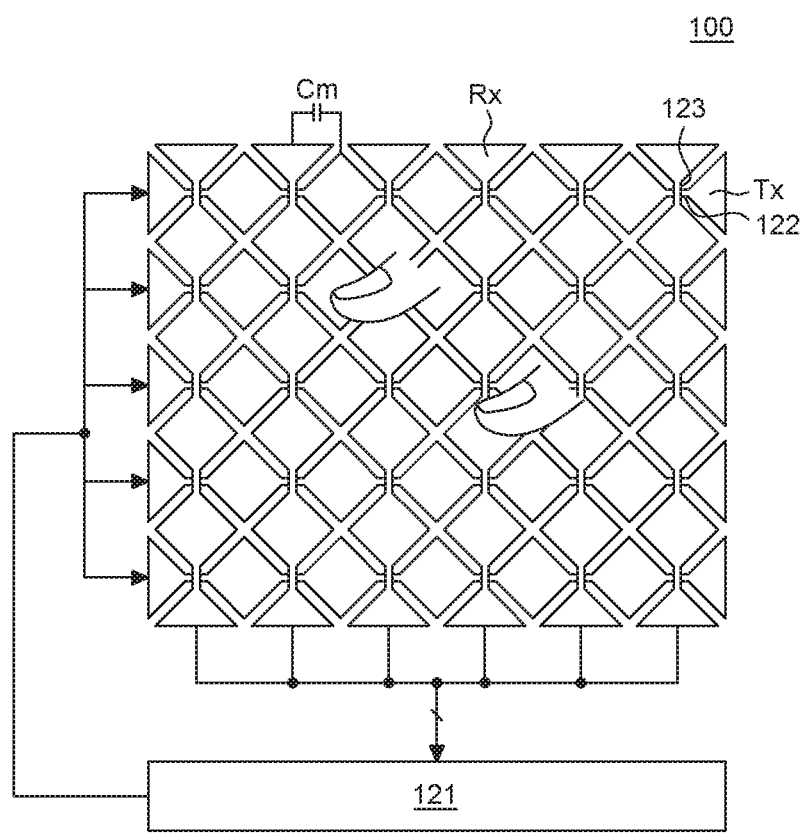
FIG. 2 is a view showing an example of a touch screen panel in which mutual capacitance sensors are arranged.

FIG. 1 is a schematic view illustrating a structure of an electroluminescence display device according to an embodiment of the present disclosure. FIG. 2 is a view showing an example of a touch screen panel in which mutual capacitance sensors are arranged.

Referring to FIG. 1, the electroluminescence display device 100 according to an exemplary embodiment of the present disclosure may include a display panel 110, a touch screen panel 120, a sensor driving circuit 121, and a display driving circuit.

The touch screen panel 120 may be implemented in a capacitive technique that senses touch input through a plurality of capacitive sensors. The touch screen panel 120 has a touch sensor array. The touch sensor array may include a plurality of touch sensors generating mutual capacitances. Mutual capacitance can be formed between the crossing electrodes.

The touch screen panel 120, implemented as the mutual capacitive sensor Cm may include a first electrode line 122, a second electrode line 123 intersecting with the first electrode line 122, and a mutual capacitance sensor Cm formed at the intersection of the first electrode line 122 and the second electrode line 123 as shown in FIG. 2.

The first electrode line 122 is a driving signal line for supplying a charge to the touch sensor by applying a driving signal of the touch screen panel 120 to each mutual capacitance sensor Cm. The second electrode line 123 is a sensor line connected to the mutual capacitance sensor Cm and supplying the charge of the touch sensor to the sensor driving circuit 121. The mutual capacitance sensing method can detect touch input by applying a driving signal to the first electrode Tx through the first electrode line 122 to supply charge to the mutual capacitance sensor Cm, and by sensing capacitance change of the mutual capacitance sensor Cm through the second electrode Rx and the second electrode line 123 in synchronization with the driving signal of the touch screen panel 120.

The sensor driving circuit 121 senses the amount of change in capacitance of the touch sensor before and after the touch to determine whether or not the conductive material such as a finger touches the touch screen panel and its position.

The timing control signal generator in the timing controller 113 may drive the display driving circuit during the display driving period and drive the sensor driving circuit 121 during the touch sensor driving period. The timing control signal generator may generate a timing control signal for controlling the operation timing of the display driving circuit and the sensor driving circuit 121.

The sensor driving circuit 121 may be connected to a driving power source (not shown) to receive driving power. For example, the sensor driving circuit 121 and the driving power source may be mounted on a separate flexible printed circuit (FPC) (not shown).

The sensor driving circuit 121 detects the amount of charge change before and after the touch input from the touch sensor signal and compares the amount of charge change with the certain threshold value. Therefore, the position of the touch sensor having the charge change amount equal to or larger than the threshold value can be determined as the touch input area.

The sensor driving circuit 121 calculates coordinates for each touch input. Therefore, the touch data TDATA(XY) including the touch input coordinate information can be transmitted to the external host system 114. The sensor driving circuit 121 may include an amplifier for amplifying the charge of the touch sensor, an integrator for accumulating the charge received from the touch sensor, an ADC (Analog to Digital Converter) for converting the voltage of the integrator into digital data, and an arithmetic logic section.

The pixel array of the display panel 110 includes pixels formed in the display area configured by the data lines D1 to Dm, where m is a positive integer and the gate lines G1 to Gn, where n is a positive integer. Each of the pixels may include an electroluminescence diode that is a self-luminous element.

Although not shown in detail, a plurality of data lines and a plurality of gate lines are intersected with each other in the display panel 110, and pixels may be arranged in a matrix form in each of the intersection areas. Each of the pixels includes an electroluminescence diode, a driving thin film transistor TFT for controlling the amount of current flowing in the electroluminescence diode, a programming unit for setting a gate-source voltage of the driving thin film transistor, and a switching unit for interconnecting or disconnecting the common voltage source and the low potential voltage sources to each other.

The display driving circuit may include a data driving circuit 111, a gate driving circuit 112 and a timing controller 113 to write the video data voltage of the input image to the pixels of the display panel 110.

The data driving circuit 111 can convert the digital video data RGB input from the timing controller 113 into an analog gamma compensation voltage to generate a data voltage. The data voltage output from the data driving circuit 111 may be supplied to the data lines D1 to Dm. The gate driving circuit 112 can sequentially supply the gate pulses synchronized with the data voltages to the gate lines G1 to Gn to select pixels of the display panel 110 into which the data voltages are written.

The timing controller 113 may synchronize the operation timing of the data driving circuit 111 and the gate driving circuit 112 by receiving input timing signals such as a vertical synchronization signal Vsync, a horizontal synchronization signal Hsync, a data enable signal DE, a main clock MCLK, and the like from the host system 114. The data timing control signal for controlling the data driving circuit 111 may include a source sampling clock SSC, a source output enable SOE signal, and the like. The gate timing control signal for controlling the gate driving circuit 112 may include a gate start pulse GSP, a gate shift clock GSC, a gate output enable signal GOE, and the like The host system 114 may be implemented in any one of a television system, a set-top box, a navigation system, a DVD player, a Blu-ray player, a personal computer PC, a home theater system, or a phone system. The host system 114 may convert the digital video data RGB of the input image into a format suitable for display on the display panel 110, including a system on chip (SoC) having a built-in scaler. The host system 114 may transmit timing signals (Vsync, Hsync, DE, MCLK) to the timing controller 113 together with the digital video data.

As described above, the sensor driving circuit 121 and the driving power source may be mounted on a separate flexible printed circuit board, and the flexible printed circuit board may be mounted on the touch screen panel 120 through film On Glass (FOG), thus, it can be electrically connected.

The present disclosure is characterized in that the pad of the touch screen panel 120 is protected from cracking through the novel structure in the electroluminescence display device 100 having the top plate integrated type touch screen panel 120.

That is, when film on glass (FOG) bonding is performed, by disposing the lower layer of the flexible printed circuit board at a predetermined distance away from the end of the touch screen panel 120, the release of the anisotropic conductive film (ACF) and the pressing of the adhesive by the flexible printed circuit board are alleviated. Thus, it is possible to suppress the pad portion of the touch screen panel 120 from being cracked.

Hereinafter, an electroluminescence display device according to an embodiment of the present disclosure having the structure described above with reference to FIG. 3 will be described in detail.

Figure 3:
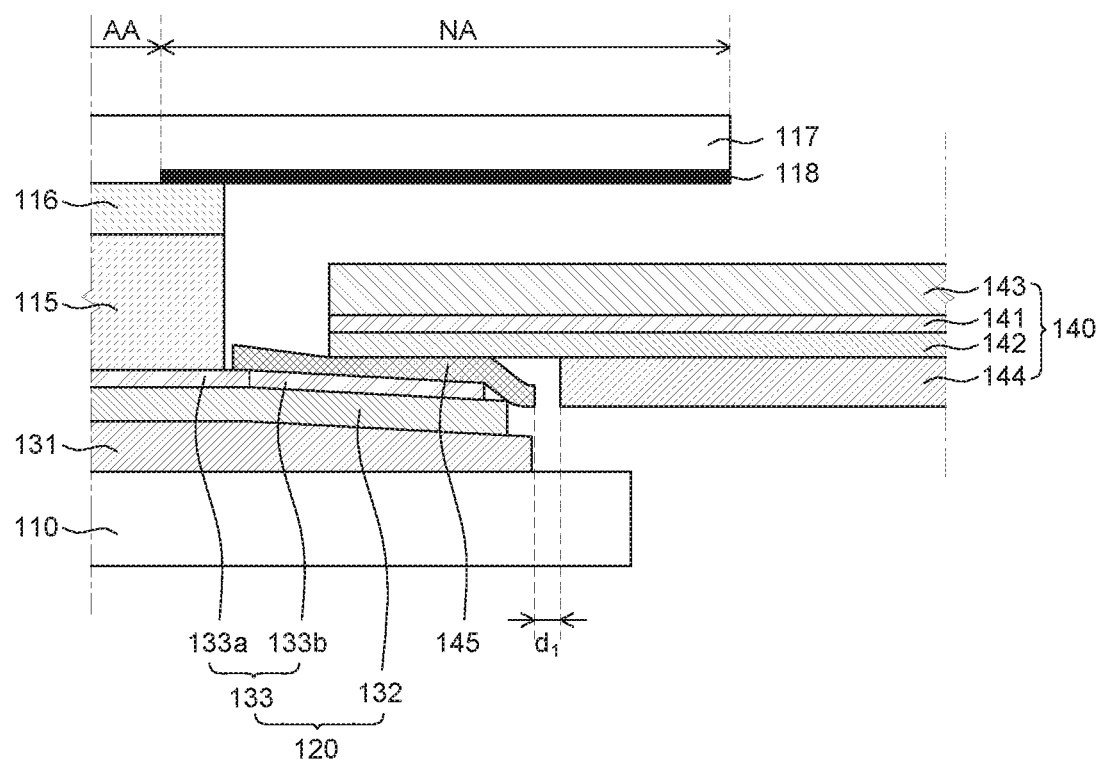
FIG. 3 is a cross-sectional view schematically illustrating an electroluminescence display device according to an embodiment of the present disclosure.

FIG. 3 is a cross-sectional view schematically illustrating an electroluminescence display device according to an embodiment of the present disclosure.

Referring to FIG. 3, an electroluminescence display device 100 according to an embodiment of the present disclosure may include a display panel 110 and a touch screen panel 120 disposed on the display panel 110.

Although not shown in detail, the display panel 110 may include a substrate on which a plurality of elements is disposed. The substrate may be formed of glass or a plastic material having flexible properties. For example, the substrate can be made of any of a variety of materials including polyimide (PI), polyethylene terephthalate (PET), polyethylene naphthalate (PEN), polycarbonate (PC), polyether sulfone (PES), polyarylate (PAR), polysulfone (PSF), cyclic-olefin copolymer (COC), and the like. On the substrate, a pixel array including a thin film transistor and an electroluminescence diode may be formed.

The display panel 110 may include a pixel for displaying an input image, and a plurality of pixels may be arranged on a substrate in a matrix form. Each pixel may include an electroluminescence diode and a thin film transistor for driving the electroluminescence diode.

The thin film transistor may include at least one switching thin film transistor and a driving thin film transistor for driving the electroluminescence diode. The driving thin film transistor serves to drive the electroluminescence diode of the pixel selected by the switching thin film transistor. The structure of the thin film transistor may include any structure that can drive the electroluminescence display device 100 such as a top-gate structure, a bottom-gate structure, and a double-gate structure.

The electroluminescence diode may include a first electrode connected to the driving thin film transistor, that is, an anode electrode, an organic compound layer formed on the anode electrode, and a second electrode formed on the organic compound layer, that is, a cathode electrode. The organic compound layer may include an emission layer (EML) and may further include a common layer. The common layer may include at least one among a hole injection layer (HIL), a hole transport layer (HTL), an electron transport layer (ETL), and an electron injection layer (EIL).

On the display panel 110 having the above-described structure, a touch screen panel 120 for sensing a touch input may be disposed. Sensors may be arranged in the touch screen panel 120. The sensor may be driven by a mutual capacitance sensor. As described above, the mutual capacitance sensor may include mutual capacitance formed between the two electrodes (see FIG. 2). The sensor driving circuit 121 may apply a driving signal (or stimulus signal) to one of the two electrodes and sense the touch input based on the amount of change in the mutual capacitance sensed through the other electrode. As the conductor approaches the mutual capacitance, the amount of charge in the mutual capacitance is reduced and the touch input can be sensed.

The touch screen panel 120 may include a base film 132 and a touch circuit unit 133 having various electrodes and signal lines on the base film 132.

The base film 132 may be an encapsulation substrate provided to protect the elements of the display panel 110 from the external environment. That is, an element of the touch sensor can be directly formed on the upper surface of the encapsulation substrate. However, the present disclosure is not limited thereto, and a device including the touch sensor may be directly formed on the bottom surface of the encapsulation substrate.

The base film 132 may be formed of a polymer film such as a cycloolefin polymer (COP) or a polycarbonate (PC).

For example, the electrodes provided on the top surface of the encapsulation substrate may include a first electrode and a second electrode which intersect with each other. At this time, any one of the first electrode and the second electrode may be separated, and one of the separated electrodes may be electrically connected through a bridge pattern. The first electrode and the second electrode may be insulated from each other through an insulating film.

The touch circuit unit 133 of the touch screen panel 120 may include a sensing unit (not shown) in which the first and second electrodes and the first and second electrode lines are disposed, the pad portion 133b to which the flexible printed circuit board 140 is attached via the anisotropic conductive film 145, and a link portion 133a for communicating a signal between the sensing unit and the pad portion 133b.

The touch screen panel 120 included in the electroluminescence display device 100 according to an embodiment of the present disclosure is not limited to the above-described structure, and various types of touch screen panel structures may be included according to the engineer's choice.

The electroluminescence display device 100 according to an embodiment of the present disclosure may further include a polarizing film 115 disposed on the touch screen panel 120.

The electroluminescence display device 100 according to an embodiment of the present disclosure may further include a cover glass 117 disposed on the polarizing film 115 and may be disposed to cover a part of the circuit board 140.

The cover glass 117 can be defined as a display area AA and a non-display area NA on the periphery of the display area AA. In the lower part of the non-display area NA of the cover glass 117, a shield layer 118 such as black matrix may be printed or coated.

The cover glass 117 may be attached onto the polarizing film 115 through the adhesive film 116 of an optically clear adhesive (OCA) film.

The flexible printed circuit board 140 may be attached to the touch screen panel 120 through the anisotropic conductive film 145 as described above.

The flexible printed circuit board 140 may include a conductive layer 142 on which a copper (Cu) line is printed on a polyimide (PI) 141, an upper layer 143 attached on the upper side of the conductive layer 142, and a lower layer 144 attached on the lower side of the conductive layer 142. The lower side of the conductive layer 142 can be on an opposite side of the upper side of the conductive layer 142.

Both of the upper layer 143 and the lower layer 144 may be insulating layers other than conductive layers such as a coverlay.

The surface of the conductive layer 142 in contact with the lower layer 144 may further include an oxidation protection layer.

The conductive layer 142 may be attached to the pad portion 133b of the touch screen panel 120 via the anisotropic conductive film 145 and electrically connected thereto.

The touch screen panel 120 may be attached to the display panel 110 via an adhesive 131.

The adhesive 131 may include any adhesive including a barrier film or a coating layer.

The adhesive 131 may include pressure sensitive adhesive (PSA).

As described above, the present disclosure is characterized in that the position of the lower layer 144 of the flexible printed circuit board 140 is spaced apart from the touch screen panel 120 by a predetermined distance d1. The predetermined distance d1 may be determined from the end of the lower layer 144 to the end of the adhesive 131, the end of the touch screen panel 120, or to the end of the anisotropic conductive film 145. For example, the predetermined distance d1 is determined from the end of the lower layer 144 to the end of the anisotropic conductive film 145 (as shown in FIG. 3). In some embodiments, the predetermined distance d1 is determined from the component which is closest to the lower layer 144.

For example, the lower layer 144 of the flexible printed circuit board 140 according to an embodiment of the present disclosure may be spaced apart from the ends of the adhesive 131 and the touch screen panel 120 by a predetermined distance d1. As the lower layer 144 of the flexible printed circuit board 140 is disposed at a predetermined distance from the end of the touch screen panel 120, thereby reducing the anisotropic conductive film 145 being leaked out from the flexible printed circuit board 140 and the adhesive 131 being pressed down when the film-on-glass (FOG) bonding is performed. Therefore, it is possible to suppress the pad portion 133b of the touch screen panel 120 from being cracked.

That is, the lower layer 144 of the flexible printed circuit board 140 is spaced apart from the ends of the adhesive 131 and the touch screen panel 120 by a predetermined distance d1. Because of the predetermined distance d1, the lower layer 140 does not come into contact with the ends of the adhesive 131 or the touch screen panel 120 even if the adhesive 131 partially protrudes from the end of the touch screen panel 120 due to the high temperature adhesion of the flexible printed circuit board 140. That is, the predetermined distance d1 from the lower layer 144 of the flexible printed circuit board 140 to the adhesive 131 and the end of the touch screen panel 120 is larger than the amount the adhesive 131 protrudes from the end of the touch screen panel 120.

It should be noted that the process margin and the size of the electroluminescence display device 100 may differ. However, considering the adhesion error tolerance of the touch screen panel about 120 µm to 150 µm as an example, the lower layer 144 of the flexible printed circuit board 140 may be separated from the end of the adhesive 131 and the touch screen panel 120 by about 150 µm to about 500 µm, preferably about 330 µm.

The degree to which the adhesive 131 protrudes from the end of the touch screen panel 120 may be a minimum value of the separation predetermined distance d1 of the lower layer 144 of the flexible printed circuit board 140 as described above. That is, it may have a value smaller than 150 µm.

At this time, the adhesive 131 may protrude from the end of the touch screen panel 120 and the lower layer 144 of the flexible printed circuit board 140 may be spaced apart from the end of the protruded adhesive 131 by a predetermined distance d1.

The adhesive 131 and the touch screen panel 120 may be configured to include a portion to which the flexible printed circuit board 140 is attached so that a certain portion of the adhesive 131 and the touch screen panel 120 are inclined toward the display panel 110.

In addition, the anisotropic conductive film 145 may be pressed by the flexible printed circuit board 140 and partially protrude from the end of the touch screen panel 120. In this case, the protruding anisotropic conductive film 145 may be spaced a predetermined distance d1 from the lower layer 144 of the flexible printed circuit board 140 to expose the conductive layer 142. However, the present disclosure is not limited thereto, and an oxidation protection layer may be additionally formed on the surface of the conductive layer 142 to protect the exposed conductive layer 142 from being oxidized and corroded.

As described above, according to the present disclosure, by disposing the lower layer 144 of the flexible printed circuit board 140 at a predetermined distance d1 from the end of the touch screen panel 120, the degree of the protrusion of the anisotropic conductive film 145 and the pressed adhesive 131 by the flexible printed circuit board 140 during film-on glass (FOG) bonding are alleviated. Therefore, it is possible to suppress the pad portion 133b of the touch screen panel 120 from being cracked. The fabrication method of the electroluminescence display device will be described below.

FIGS. 4A to 4D are cross-sectional views sequentially illustrating a method of manufacturing an electroluminescence display device according to an embodiment of the present disclosure shown in FIG. 3. FIG. 5 is a cross-sectional view illustrating an electroluminescence display device of according to a comparative example.

Figure 4A:
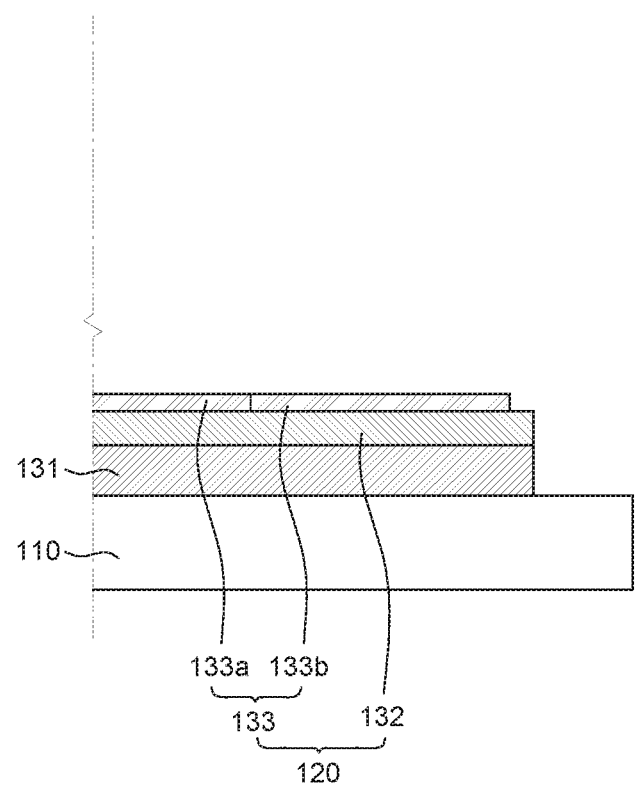
FIGS. 4A to 4D are cross-sectional views sequentially illustrating a method of manufacturing an electroluminescence display device according to an embodiment of the present disclosure shown in FIG. 3.
Figure 5:
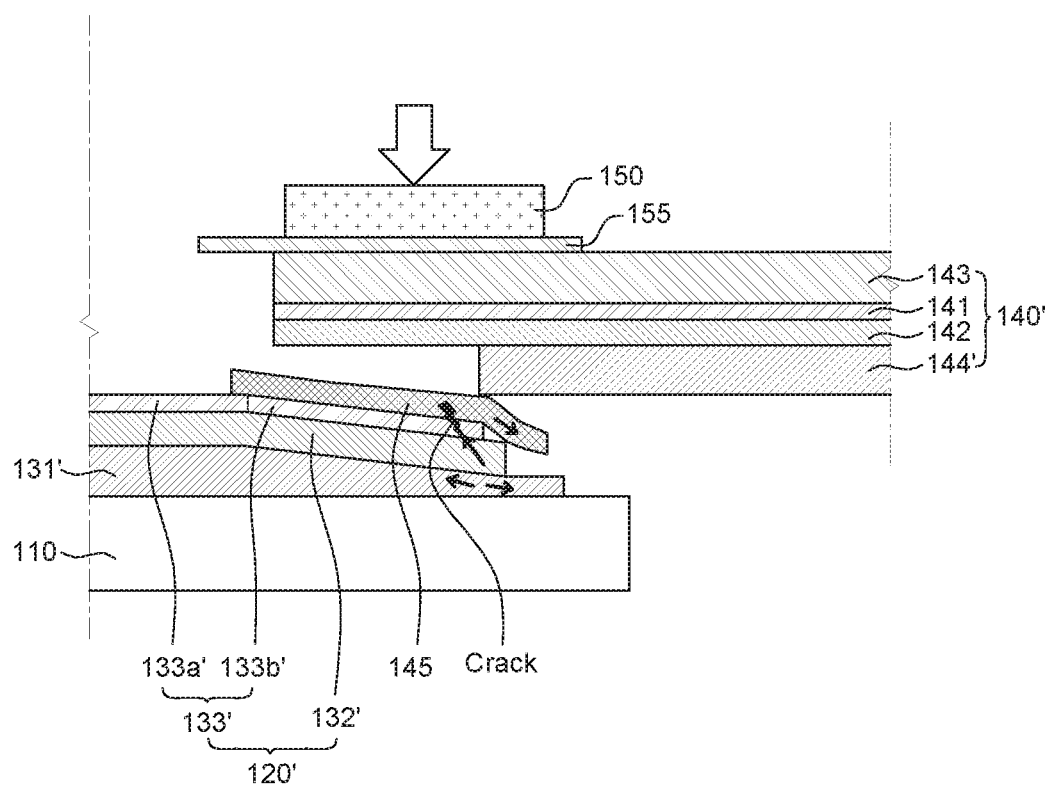
FIG. 5 is a cross-sectional view showing an electroluminescence display device according to a comparative example.

Referring to FIG. 4A, the touch screen panel 120 may be attached to the display panel 110 with an adhesive 131 therebetween.

At this time, the display panel 110 may include pixels formed in the display area with the data lines and the gate lines.

Each of the pixels may include an electroluminescence diode that is a self-emissive element.

The touch screen panel 120 may be implemented in a capacitive manner that senses touch input through a plurality of capacitive sensors.

The touch screen panel 120 has a touch sensor array. The touch sensor array may include a plurality of touch sensors having mutual capacitances. Mutual capacitance can be formed between the crossing electrodes.

The touch screen panel 120 may include a base film 132 and a touch circuit unit 133 having various electrodes and signal lines on the base film 132.

The base film 132 may be an encapsulation substrate provided to protect the elements of the display panel 110 from the external environment.

The base film 132 may be formed of a polymer film such as a cycloolefin polymer (COP) or a polycarbonate (PC).

The touch circuit unit 133 of the touch screen panel 120 may include a sensing unit (not shown) in which the first and second electrodes and the first and second electrode lines are disposed, the pad portion 133b to which the flexible printed circuit board 140 is attached via the anisotropic conductive film 145, and a link portion 133a for communicating a signal between the sensing unit and the pad portion 133b.

Figure 4B:
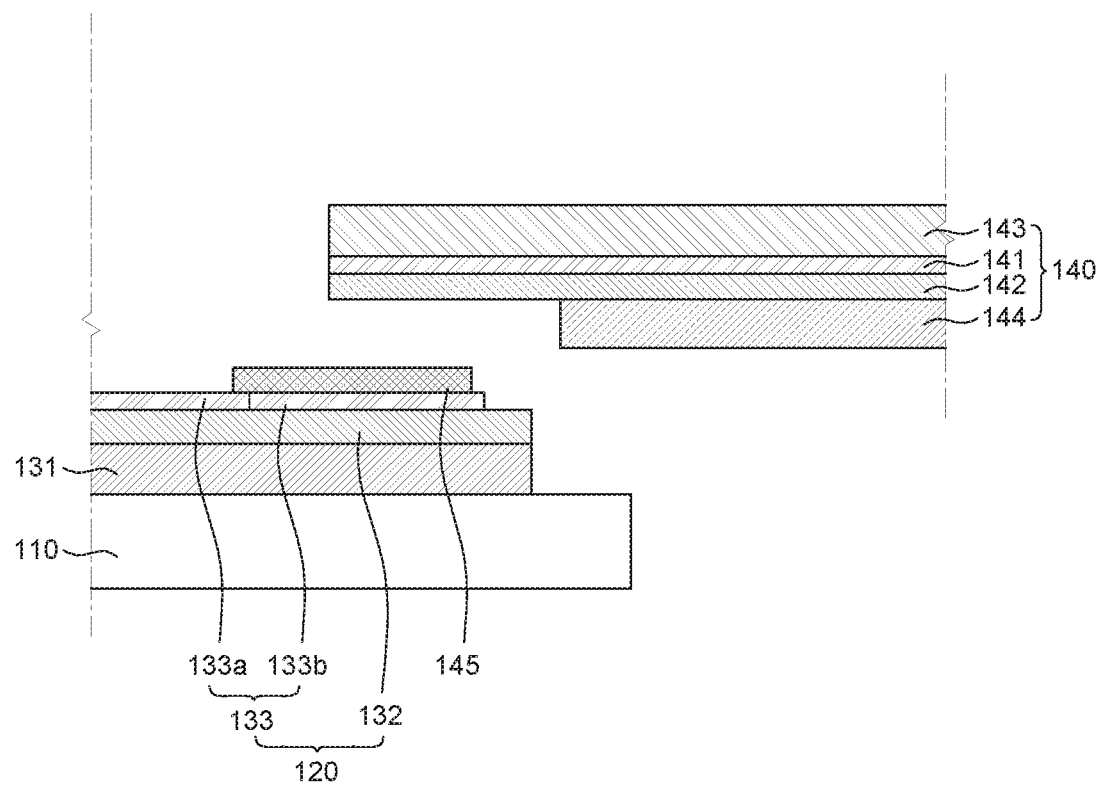

Next, referring to FIG. 4B, an anisotropic conductive film 145 may be attached on the pad portion 133b of the touch screen panel 120.

Figure 4C:
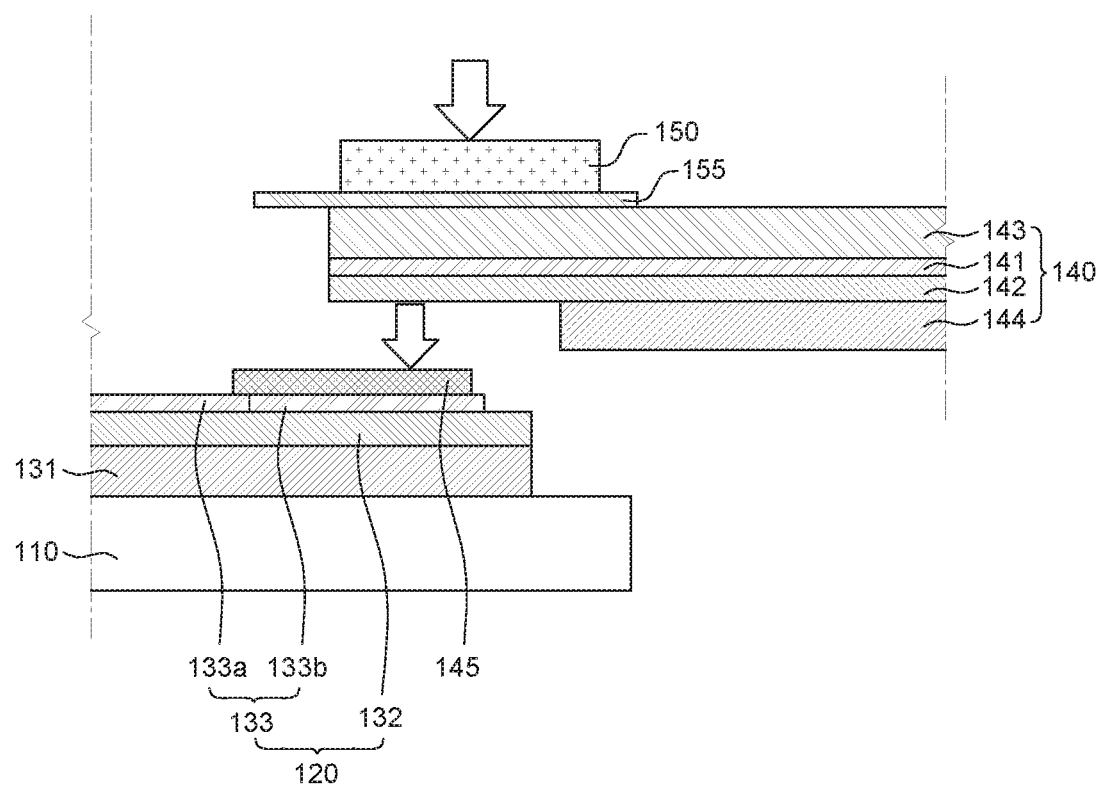
Figure 4D:
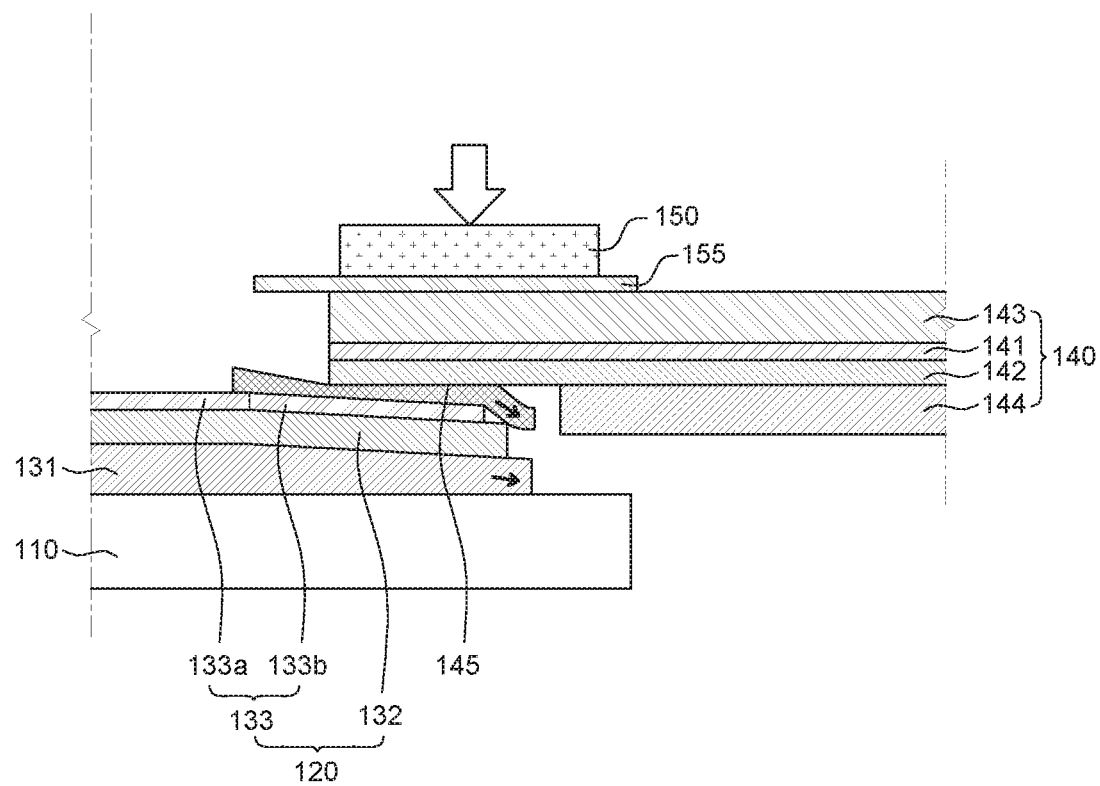

Next, referring to FIGS. 4C and 4D, the flexible printed circuit board 140 can be attached to the pad portion 133b of the touch screen panel 120 by pressing at a high temperature.

The flexible printed circuit board 140 may be attached to the pad portion 133b of the touch screen panel 120 through the anisotropic conductive film 145.

After the flexible printed circuit board 140 is pre-bonded to the anisotropic conductive film 145 through press bonding, the main bonding can be performed through the final press bonding. However, the present disclosure is not limited thereto.

At the time of this pressing, the tool bar 150 can be used.

A Teflon sheet 155 may be interposed between the tool bar 150 and the flexible printed circuit board 140 to uniformly apply pressure.

The Teflon sheet 155 can provide a buffering function and a uniform pressing force.

As described above, there has been a problem in that a crack is generated in the pad portion of the touch screen panel or a channel is opened due to insufficient indentation depends on the film-on-glass bonding conditions. That is, a crack can be occurred in the pad portion when bonding, and if the pressure was lowered to reduce the crack level, the indentation becomes weaker and the channel could be opened.

The inventors of the present disclosure have recognized that a pad crack or channel open failure is caused by a step between a touch screen panel including an anisotropic conductive film and a lower layer of a flexible printed circuit board. That is, referring to FIG. 5, it has been recognized that the lower layer 144' of the flexible printed circuit board 140' having a step with respect to the touch screen panel 120' presses the anisotropic conductive film 145' and the adhesive 131' at the film-on-glass bonding, the adhesive 131' thermally deforms by being pressed at a high temperature, the touch screen panel 120' is collapsed. Accordingly, it is recognized that a crack occurs in the pad portion 133b'. In such a case when the lower layer 144' of the flexible printed circuit board 140' overlaps the touch screen panel 120' as illustrated in the comparative example, the larger force is applied to the lower side of the touch screen panel 120' due to the step of the lower layer 144' of the flexible printed circuit board 140'. Therefore, since the adhesive 131' is pressed by a large pressure, it is noticeably pushed to right and left sides.

Thus, the inventors of the present disclosure invented a structure in which the position of the lower layer 144 of the flexible printed circuit board 140 is arranged at a predetermined distance d1 away from the touch screen panel 120.

At this time, the flexible printed circuit board 140 is attached to the pad portion 133b of the touch screen panel 120 in a state where the lower layer 144 is spaced apart from the end of the adhesive 131 and the end of the touch screen panel 120.

A portion of the adhesive 131 may slightly protrude from the end of the touch screen panel 120 at the time of pressing (the main bonding) at a high temperature. At this time, the flexible printed circuit board 140 can be mounted on the pad portion 133b of the touch screen panel 120 in a state where the lower layer 144 of the flexible printed circuit board 140 is spaced apart from the end of the protruded adhesive 131.

In addition, at the time of pressing (the main bonding) at a high temperature, a part of the anisotropic conductive film 145 may be pressed by the flexible printed circuit board 140 and protrude from the end of the touch screen panel 120. The protruding anisotropic conductive film 145 may be spaced apart from the lower layer 144 of the flexible printed circuit board 140 by a predetermined distance d1 to expose the conductive layer 142.

At this time, in order to suppress the exposed conductive layer 142 from being oxidized and corroded, an oxidation protection layer may be additionally formed on the surface of the conductive layer in contact with the lower layer, which will be described in detail with reference to another embodiment of the present disclosure.

Figure 6:
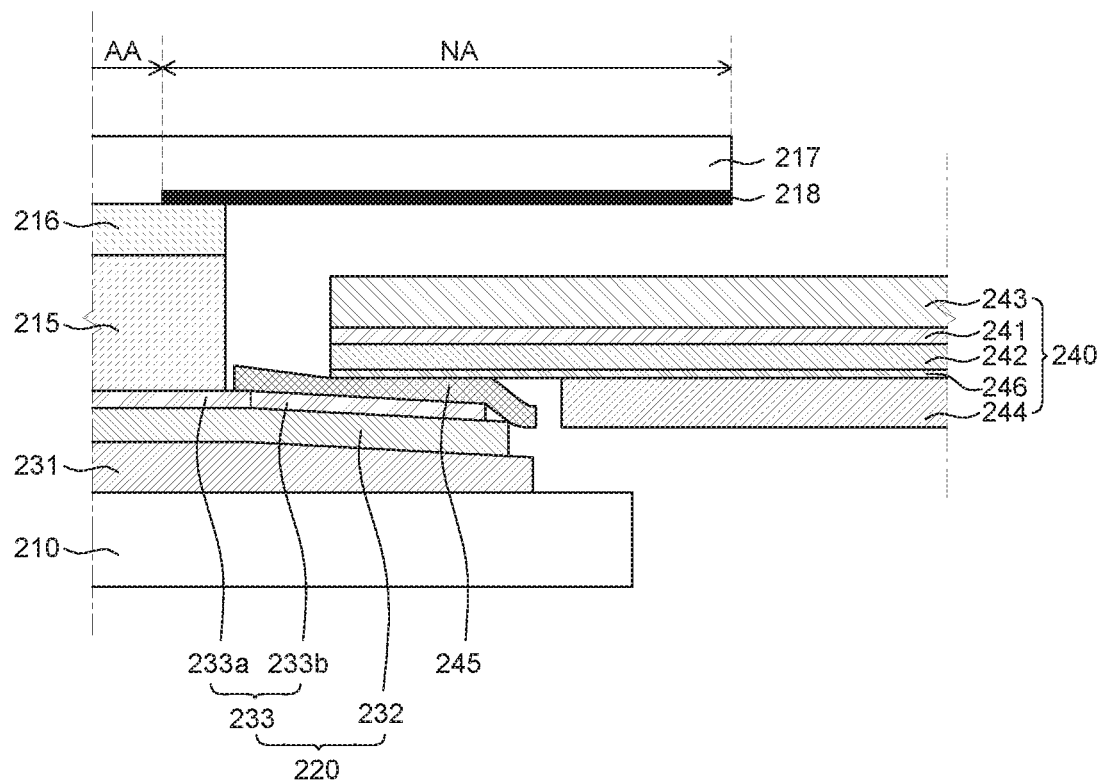
FIG. 6 is a cross-sectional view schematically illustrating an electroluminescence display device according to another embodiment of the present disclosure.

FIG. 6 is a cross-sectional view schematically illustrating an electroluminescence display device according to another embodiment of the present disclosure. The electroluminescence display device shown in FIG. 6 is substantially the same as the electroluminescence display device shown in FIG. 3, except that an oxidation protection layer 246 is additionally formed on the surface of the conductive layer 242. Therefore, descriptions of the redundant features will be omitted for convenience of explanation.

Referring to FIG. 6, an electroluminescence display device 200 according to another exemplary embodiment of the present disclosure may include a display panel 210 and a touch screen panel 220 on the display panel 210.

Although not shown in detail, the display panel 210 may include a substrate on which a plurality of elements is disposed. On the substrate, a pixel array including a thin film transistor and an electroluminescence diode may be formed.

A touch screen panel 220 may be disposed on the display panel 210. Sensors may be arranged on the touch screen panel 220. The sensor may be driven by a mutual capacitance sensor.

The touch screen panel 220 may include a base film 232 and a touch circuit unit 233 having various electrodes and signal lines on the base film 232.

The base film 232 may be an encapsulation substrate provided to protect the elements of the display panel 210 from the external environment.

The touch circuit unit 233 of the touch screen panel 220 may include a sensing unit (not shown) in which the first and second electrodes and the first and second electrode lines are disposed, the pad portion 233b to which the flexible printed circuit board 240 is attached via the anisotropic conductive film 245, and a link portion 233a for communicating a signal between the sensing unit and the pad portion 233b.

The electroluminescence display device 200 according to another embodiment of the present disclosure may further include a polarizing film 215 disposed on the touch screen panel 220.

Further, the electroluminescence display device 200 according to another embodiment of the present disclosure may further include a cover glass 217 disposed on the polarizing film 215.

The cover glass 217 may be disposed to cover a portion of the flexible printed circuit board 240.

The cover glass 217 can be defined as a display area AA and a non-display area NA on the periphery of the display area AA. In the lower part of the non-display area NA of the cover glass 217, a shield layer 218 such as black matrix may be printed or coated.

The cover glass 217 may be attached onto the polarizing film 215 through the adhesive film 216.

The flexible printed circuit board 240 may be attached to the touch screen panel 220 through the anisotropic conductive film 245.

The flexible printed circuit board 240 may include a conductive layer 242 on which a copper (Cu) line is printed on a polyimide (PI) 241, an upper layer 243 attached on the upper side of the conductive layer 242, and a lower layer 244 attached on the lower side of the conductive layer 242.

Both of the upper layer 243 and the lower layer 244 may be insulating layers other than conductive layers such as a coverlay.

The anti-oxidation layer 246 may be further provided on the surface of the conductive layer 242 in contact with the lower layer 244. In this case, oxidation of the conductive layer 242 exposed to the outside can be suppressed according to the above-described structure.

For example, an aluminum film is formed on the conductive layer 242 by a CVD (Chemical Vapor Deposition) process, and the entire surface is heat-treated to oxidize the aluminum film to form aluminum oxide ($Al_2O_3$).

Alternatively, an aluminum film may be formed on the conductive layer 242 by a PVD (Physical Vapor Deposition) process, and the aluminum film may be nitrided to convert it to aluminum nitride (AlN) by surface treatment using a nitrogen plasma.

Alternatively, the surface of the conductive layer 242 made of copper may be chemically oxidized to form a copper oxide film on the surface thereof to be used as the anti-oxidation layer 246. However, the present disclosure is not limited to the above-mentioned method, and the anti-oxidation layer 246 can be formed by various methods.

The anti-oxidation layer 246 may be formed on the entire surface of the conductive layer 242. However, the present disclosure is not limited thereto, and the anti-oxidation layer may be formed only on a part of the surface of the conductive layer 24 exposed to the outside.

The conductive layer 242 may be attached to the pad portion 233b and electrically connected to the pad portion 233b of the touch screen panel 220 through the anisotropic conductive film 245.

The touch screen panel 220 may be attached to the display panel 210 via an adhesive 231.

In an electroluminescence display device 200 according to another embodiment of the present disclosure, the lower layer 244 of the flexible printed circuit board 240 may be spaced a predetermined distance d1 (not shown in FIG. 6) from the ends of the adhesive 231 and the touch screen panel 220, as in the case of the above-described embodiment of the present disclosure. Thus, the lower layer 244 of the flexible printed circuit board 240 is disposed at a predetermined distance d1 from the end of the touch screen panel 220. Accordingly, the protruding of the anisotropic conductive film 245 and the pressing of the adhesive 231 by the flexible printed circuit board 240 during film-on-glass bonding are reduced. Therefore, it is possible to suppress the pad portion 233b of the touch screen panel 220 from being cracked.

At this time, the adhesive 231 may partially protrude from the end of the touch screen panel 220, and the lower layer 244 of the flexible printed circuit board 240 may be spaced from the end of the protruding adhesive 231 by a predetermined distance d1.

In addition, the adhesive 231 and the touch screen panel 220 may include a portion to which the flexible printed circuit board 240 is attached so that a certain portion of the adhesive 231 and the touch screen panel 220 are tilted toward the display panel 210.

In addition, the anisotropic conductive film 245 may be pressed by the flexible printed circuit board 240 and partially protrude from the end of the touch screen panel 220. In this case, the protruding anisotropic conductive film 245 may be spaced a predetermined distance d1 from the lower layer 244 of the flexible printed circuit board 240 to expose the anti-oxidation layer 246.

Next, by adjusting the area of the anisotropic conductive film 245, it is possible to suppress the anisotropic conductive film 245 from being protruded from the end of the touch screen panel 220 when pressed at a high temperature, which will be described in detail with reference to the other embodiment of the present disclosure.

Figure 7:
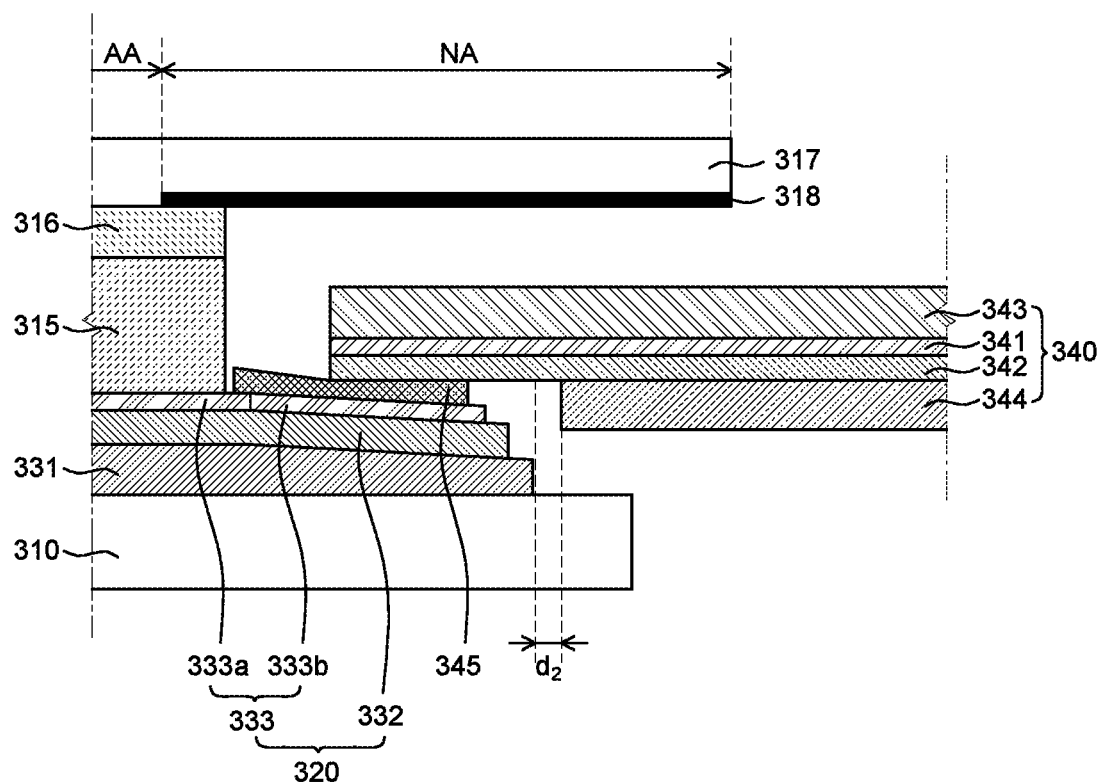
FIG. 7 is a cross-sectional view schematically illustrating an electroluminescence display device according to another embodiment of the present disclosure.

FIG. 7 is a cross-sectional view schematically illustrating an electroluminescence display device according to the other embodiment of the present disclosure. The electroluminescence display device shown in FIG. 7 is substantially the same as the electroluminescence display device shown in FIG. 3, except that the anisotropic conductive film is not protruded from the end of the touch screen panel. Therefore, descriptions of the redundant features will be omitted for convenience of explanation.

Referring to FIG. 7, an electroluminescence display device 300 according to the other embodiment of the present disclosure may include a display panel 310 and a touch screen panel 320 on the display panel 310.

The display panel 310 may include a substrate on which a plurality of elements is disposed. On the substrate, a pixel array including a thin film transistor and an electroluminescence diode may be formed.

A touch screen panel 320 may be disposed on the display panel 310. Sensors may be arranged on the touch screen panel 320. The sensor may be driven by a mutual capacitance sensor.

The touch screen panel 320 may include a base film 332 and a touch circuit unit 333 having various electrodes and signal lines on the base film 332.

The base film 332 may be an encapsulation substrate provided to protect the elements of the display panel 310 from the external environment.

The touch circuit unit 333 of the touch screen panel 320 may include a sensing unit (not shown) in which the first and second electrodes and the first and second electrode lines are disposed, the pad portion 333b to which the flexible printed circuit board 340 is attached via the anisotropic conductive film 345, and a link portion 333a for communicating a signal between the sensing unit and the pad portion 333b.

The electroluminescence display device 300 according to the other embodiment of the present disclosure may further include a polarizing film 315 disposed on the touch screen panel 320.

In addition, the electroluminescence display device 300 according to the other embodiment of the present disclosure may further include a cover glass 317 disposed on the polarizing film 315.

The cover glass 317 may be disposed to cover a portion of the flexible printed circuit board 340.

The cover glass 317 can be defined as a display area AA and a non-display area NA on the periphery of the display area AA. In the lower part of the non-display area NA of the cover glass 317, a shield layer 318 such as black matrix may be printed or coated.

The cover glass 317 may be attached onto the polarizing film 315 through the adhesive film 316.

The flexible printed circuit board 340 may be attached over the touch screen panel 320 via an anisotropic conductive film 345.

The flexible printed circuit board 340 may include a conductive layer 342 on which a copper (Cu) line is printed on a polyimide (PI) 341, an upper layer 343 attached on the upper side of the conductive layer 342, and a lower layer 344 attached on the lower side of the conductive layer 342.

Both of the upper layer 343 and the lower layer 344 may be insulating layers other than conductive layers such as a coverlay.

The conductive layer 342 may be attached to the pad portion 333b of the touch screen panel 320 via the anisotropic conductive film 345 and electrically connected thereto.

The touch screen panel 320 may be attached to the display panel 310 via an adhesive 331.

In an electroluminescence display device 300 according to the other embodiment of the present disclosure, like the above-described embodiment of the present disclosure and another embodiment of the present disclosure, the lower layer 344 of the flexible printed circuit board 340 may be spaced a predetermined distance d2 from the ends of the adhesive 331 and the touch screen panel 320. Thus, the lower layer 344 of the flexible printed circuit board 340 is disposed at a predetermined distance d2 from the end of the touch screen panel 320. Accordingly, the protruding of the anisotropic conductive film 345 and the pressing of the adhesive 331 by the flexible printed circuit board 340 during film-on-glass bonding are reduced. Therefore, it is possible to suppress the pad portion 333b of the touch screen panel 320 from being cracked.

In particular, in the electroluminescence display device 300 according to the other embodiment of the present disclosure, the anisotropic conductive film 345 is designed to have a narrower width by adjusting the area of the anisotropic conductive film 345, i.e., compared with the above-described embodiment of the present disclosure and another embodiment of the present disclosure. Therefore, even if the adhesive layer is pressed at a high temperature, the anisotropic conductive film 345 can be suppressed from being protruded from the end of the touch screen panel 320. In this case, interference with the lower layer 344 of the flexible printed circuit board 340 is reduced, so that the pressing of the adhesive 331 can be further reduced.

In such case, the adhesive 331 may protrude from the end of the touch screen panel 320 and the lower layer 344 of the flexible printed circuit board 340 may be spaced apart from the end of the protruding adhesive 331 by a predetermined distance d2.

The adhesive 331 and the touch screen panel 320 may include a portion to which the flexible printed circuit board 340 is attached so that a certain portion of the adhesive 331 and the touch screen panel 320 are inclined toward the display panel 310.

The embodiments of the present disclosure may be described as follows:

An electroluminescence display device according to an embodiment of the present disclosure may include a display panel, a touch screen panel attached on the display panel by an adhesive, and a flexible printed circuit board. The flexible printed circuit board comprises a conductive layer and a lower layer covering a portion of the conductive layer, another portion of the conductive layer attached to the touch screen panel by an anisotropic conductive film, wherein the lower layer of the flexible printed circuit board is spaced apart from ends of the adhesive and the touch screen panel by at least a predetermined distance.

The flexible printed circuit board may include an upper layer at an opposite side of the conductive layer relative to the lower layer.

The upper layer and the lower layer may be made of insulating layers.

The electroluminescence display device may include an anti-oxidation layer on a surface of the other portion of conductive layer in contact with the touch screen panel.

The conductive layer may be attached to the touch screen panel by the anisotropic conductive film to electrically connect the conductive layer and the touch screen panel.

The display panel may include an electroluminescence diode.

The adhesive may include a pressure sensitive adhesive.

The adhesive may be partially protruded from the end of the touch screen panel toward the lower layer and the lower layer of the flexible printed circuit board may be spaced apart from an end of the protruded adhesive by at least the predetermined distanced.

A portion of the adhesive and the touch screen panel on which the flexible printed circuit board is attached is tilted toward the ends of the adhesive and the touch screen panel.

The anisotropic conductive film may be partially protruded from the end of the touch screen panel by pressing the flexible printed circuit board.

The conductive layer may be exposed by spacing the protruded anisotropic conductive film apart from the lower layer of the flexible printed circuit board by a predetermined distance.

A distance from the lower layer of the flexible printed circuit board to the end of the touch screen panel may be greater than a protrusion distance of the adhesive from an end of the touch screen panel.

An electroluminescence display device according to another embodiment of the present disclosure may include a display panel including an electroluminescence diode, a touch screen panel attached on the display panel by an adhesive, and a flexible printed circuit board. The flexible printed circuit board comprises a conductive layer and a lower layer. The conductive layer has a portion attached to the touch screen panel by an anisotropic conductive film. The lower layer is on another portion of the conductive layer. The lower layer of the flexible printed circuit board may be spaced apart from an end of the adhesive and a corresponding end of the touch screen panel by at least a predetermined distance.

A method of manufacturing an electroluminescence display device according to an embodiment of the present disclosure may include steps of attaching a touch screen panel to a display panel by an adhesive, attaching an anisotropic conductive film to a pad portion of the touch screen panel, and attaching a portion of a conductive layer of a flexible printed circuit board to the pad portion of the touch screen panel through the anisotropic conductive film in a manner that an insulating layer covering another portion of the conductive layer is spaced at least a predetermined distance from ends of the adhesive and the touch screen panel.

A portion of the adhesive may be protruded from the end of the touch screen panel, and the flexible printed circuit board may be attached to the pad portion of the touch screen panel with the insulating layer of the flexible printed circuit board spaced from the end of the protruded adhesive by the predetermined distance.

A portion of the anisotropic conductive film may be pressed by the flexible printed circuit board to protrude from the end of the touch screen panel, and the protruded anisotropic conductive film may be spaced apart from the insulating layer of the flexible printed circuit board by the predetermined distance to expose the conductive layer.

A display device according to another embodiment of the present disclosure may include a display panel, a touch screen panel, a layer of adhesive, and a flexible printed circuit board. The display panel can have a surface configures to display images. The touch screen panel may be on the surface of the display panel, and the touch screen panel can be configured to detect touch events on a surface of the touch screen panel. The layer of adhesive can be between the surface of the display panel and the touch screen panel. The flexible printed circuit board can be attached to the touch screen panel. The flexible printed circuit board can include a conductive layer attached to the touch screen panel via an anisotropic conductive film to transmit signals to and from the touch screen panel or the display panel, and an insulating layer covering the conductive layer, an end of the insulating layer separated from a corresponding end of the adhesive, a corresponding end of the touch screen panel, and a corresponding end of the anisotropic conductive film by at least a predetermined distance in a direction parallel to the surface of the display panel.

The display device can further comprise an anti-oxidation layer on a surface of the conductive layer in contact with the anisotropic conductive film and the insulating layer.

The display panel may include an electroluminescence diode.

The anisotropic conductive film may protrude from the corresponding end of the touch screen panel.

The flexible printed circuit board can further comprise a substrate on a surface of which the conductive layer is placed, and another insulating layer covering another surface of the conductive layer.

The layer of adhesive can include a pressure sensitive adhesive (PSA).

Although the embodiments of the present disclosure have been described in detail with reference to the accompanying drawings, it is to be understood that the present disclosure is not limited to those described embodiments and various changes and modifications may be made without departing from the scope of the present disclosure. Therefore, the embodiments disclosed in the present disclosure are not intended to limit the technical scope of the present disclosure, but to illustrate them. Thus, the technical scope of the present disclosure is not limited by these embodiments. It should be understood that the above-described embodiments are merely illustrative in all aspects and not restrictive. The scope of the present disclosure should be construed only by the appended claims, and all technical features within the scope of equivalents should be construed as being included in the scope of the present disclosure.

What is claimed is:

1. An electroluminescence display device comprising:
   a display panel;
   a touch screen panel attached to the display panel by an adhesive; and
   a flexible printed circuit board comprising a conductive layer and a lower layer covering a portion of the conductive layer, wherein another portion of the conductive layer is attached to the touch screen panel via an anisotropic conductive film,
   wherein the lower layer of the flexible printed circuit board is spaced apart from an end of the touch screen panel by at least a predetermined distance.

2. The electroluminescence display device of claim 1, wherein the flexible printed circuit board further comprises an upper layer at an opposite side of the conductive layer relative to the lower layer.

3. The electroluminescence display device of claim 2, wherein the upper layer and the lower layer are made of insulating layers.

4. The electroluminescence display device of claim 2, further comprising an anti-oxidation layer on a surface of the other portion of conductive layer in contact with the touch screen panel.

5. The electroluminescence display device of claim 2, wherein the conductive layer is attached to the touch screen panel by the anisotropic conductive film to electrically connect the conductive layer and the touch screen panel.

6. The electroluminescence display device of claim 1, wherein the display panel includes an electroluminescence diode.

7. The electroluminescence display device of claim 1, wherein the adhesive includes a pressure sensitive adhesive (PSA).

8. The electroluminescence display device of claim 1, wherein the adhesive is partially protruded from the end of the touch screen panel towards the lower layer and the lower layer of the flexible printed circuit board is spaced apart from an end of the protruded adhesive by at least the predetermined distance.

9. The electroluminescence display device of claim 1, wherein a portion of the touch screen panel on which the flexible printed circuit board is attached is tilted toward the end of the touch screen panel and an end of the adhesive.

10. The electroluminescence display device of claim 1, wherein:
    the portion of the conductive layer that is covered by the lower layer is a portion of a lower surface of the conductive layer,
    the another portion of the conductive layer that is attached to the touch screen panel via the anisotropic conductive film is another portion of the lower surface of the conductive layer, and
    the anisotropic conductive film is in contact with the another portion of the lower surface of the conductive layer.

11. A method of manufacturing an electroluminescence display device comprising:
    attaching a touch screen panel to a display panel by an adhesive;
    attaching an anisotropic conductive film to a pad portion of the touch screen panel; and
    attaching a portion of a conductive layer of a flexible printed circuit board to the pad portion of the touch screen panel via the anisotropic conductive film so that an insulating layer covering another portion of the conductive layer is spaced at least a predetermined distance from ends of the adhesive and the touch screen panel.

12. The method of claim 11,
    wherein a portion of the adhesive protrudes from the end of the touch screen panel, and
    wherein the flexible printed circuit board is attached to the pad portion of the touch screen panel with the insulating layer of the flexible printed circuit board spaced apart from the end of the protruded adhesive by the predetermined distance.

13. The method of claim 11,
wherein a portion of the anisotropic conductive film is pressed by the flexible printed circuit board to protrude from the end of the touch screen panel, and
wherein the protruded anisotropic conductive film is spaced apart from the insulating layer of the flexible printed circuit board by the predetermined distance to expose the conductive layer.

14. An electroluminescence display device comprising:
a display panel including an electroluminescence diode;
a touch screen panel attached on the display panel by an adhesive; and
a flexible printed circuit board comprising:
   a conductive layer having a portion that is attached to the touch screen panel via an anisotropic conductive film, and
   a lower layer on another portion of the conductive layer, the lower layer of the flexible printed circuit board spaced apart from an end of the adhesive and a corresponding end of the touch screen panel by at least a predetermined distance.

15. The electroluminescence display device of claim 14, wherein a distance from the lower layer of the flexible printed circuit board to the corresponding end of the touch screen is greater than a protrusion distance of the adhesive from the corresponding end of the touch screen panel.

16. A display device, comprising:
a display panel with a surface configured to display images;
a touch screen panel on the surface of the display panel, the touch screen panel configured to detect touch events on a surface of the touch screen panel;
a layer of adhesive between the surface of the display panel and the touch screen panel; and
a flexible printed circuit board attached to the touch screen panel, the flexible printed circuit board comprising:
   a conductive layer attached to the touch screen panel via an anisotropic conductive film to transmit signals to and from the touch screen panel or the display panel, and
   an insulating layer covering the conductive layer, an end of the insulating layer separated from a corresponding end of the adhesive, a corresponding end of the touch screen panel, and a corresponding end of the anisotropic conductive film by at least a predetermined distance in a direction parallel to the surface of the display panel.

17. The display device of claim 16, further comprising an anti-oxidation layer on a surface of the conductive layer in contact with the anisotropic conductive film and the insulating layer.

18. The display device of claim 16, wherein the display panel includes an electroluminescence diode.

19. The display device of claim 16, wherein the anisotropic conductive film protrudes from the corresponding end of the touch screen panel.

20. The display device of claim 16, wherein the flexible printed circuit board further comprises a substrate on a surface of which the conductive layer is placed, and another insulating layer covering another surface of the conductive layer.

21. The display device of claim 16, wherein the layer of adhesive includes a pressure sensitive adhesive (PSA).

* * * * *